(12) United States Patent
Tseng

(10) Patent No.: US 7,507,998 B2
(45) Date of Patent: Mar. 24, 2009

(54) SYSTEM FOR DISPLAYING IMAGES AND METHOD FOR FABRICATING THE SAME

(75) Inventor: Chang-Ho Tseng, Taoyuan County (TW)

(73) Assignee: TPO Displays Corp., Miao-Li County (TW)

( * ) Notice: Subject to any disclaimer, the term of this patent is extended or adjusted under 35 U.S.C. 154(b) by 188 days.

(21) Appl. No.: 11/537,121

(22) Filed: Sep. 29, 2006

(65) Prior Publication Data
US 2008/0079005 A1 Apr. 3, 2008

(51) Int. Cl.
H01L 29/786 (2006.01)
H01L 27/14 (2006.01)
H01L 29/94 (2006.01)

(52) U.S. Cl. .......................... 257/72; 257/71; 257/300; 257/306; 257/435

(58) Field of Classification Search ............... 257/71, 257/72, 296, 300, 306, 435
See application file for complete search history.

(56) References Cited

U.S. PATENT DOCUMENTS

| 6,569,717 | B1 * | 5/2003 | Murade | 438/149 |
|---|---|---|---|---|
| 6,610,997 | B2 * | 8/2003 | Murade | 257/72 |
| 6,680,488 | B2 * | 1/2004 | Shibata | 257/72 |
| 6,897,477 | B2 * | 5/2005 | Shibata et al. | 257/59 |
| 6,906,344 | B2 * | 6/2005 | Yamazaki et al. | 257/66 |
| 2003/0189207 | A1 * | 10/2003 | Murakami et al. | 257/59 |

* cited by examiner

Primary Examiner—Anh Phung
Assistant Examiner—Allison P Bernstein
(74) Attorney, Agent, or Firm—Thomas, Kayden, Horstemeyer & Risley

(57) ABSTRACT

An exemplary embodiment of a system comprises an active matrix organic electroluminescent device, having a substrate, and a plurality of scan lines and data lines disposed on the substrate, for defining a plurality of pixel regions. Each pixel structure comprises: a switching thin film transistor, a driving thin film transistor, and a storage capacitor. The switching TFT has a light-shielding layer adapted for preventing the sunlight from being incident into the switching TFT. The driving TFT is a bottom gate thin film transistor and have advantages of precisely controlling the current provided to the organic electroluminescent diode. Further, since the storage capacitor has a multilayer structure and occupies a reduced pixel area, the aperture ratio of the pixel structure can be increased.

13 Claims, 11 Drawing Sheets

SYSTEM FOR DISPLAYING IMAGES AND METHOD FOR FABRICATING THE SAME

BACKGROUND OF THE INVENTION

1. Field of the Invention

The invention relates to a system for displaying images and methods of fabricating the same and, more particularly, to a system for displaying images including active matrix organic electroluminescent devices and methods of fabricating the same.

2. Description of the Related Art

Please referring to FIG. 1, it is a schematic drawing showing a conventional pixel structure of an active matrix organic electroluminescent device (AM-OLED). The pixel structure 100 of an AM-OLED is electrically connected to a scan line 102 and a data line 104. The pixel structure 100 of the AM-OLED comprises a switching thin film transistor 110, a driving thin film transistor 120, a storage capacitor 130 and an organic light emitting diode 140. The gray level of the pixel structure 100 is determined by a data signal input from the data-line 104. When the switching thin film transistor 110 is turned on by a scanning signal input from the scan line 102, the capacitor 130 is charged to store the data signal. When the switching thin film transistor 110 is turned off, the driving thin film transistor 120 is controlled by the data signal stored in the capacitor 130 and a driving current corresponding to the data signal (gray level) is provided to the light emitting diode 140 through the driving thin film transistor 120. Specifically, the driving thin film transistor 120 is electrically connected to a power source Vdd. The current from the power source Vdd is adjusted by the driving thin film transistor 120 and the adjusted current (driving current) is provided to the light emitting diode 140 frame by frame.

Please continue to refer to FIG. 1, the switching thin film transistor 110 and the driving thin film transistor 120 can be, for example, an amorphous-silicon thin film transistor or a poly-silicon thin film transistor. Compared with the amorphous-silicon thin film transistor, the poly-silicon thin film transistor has the advantages of low power consumption and high electron mobility. Although the option of the substrate, is constrained by the temperature for fabricating the poly-silicon thin film transistor earlier, the poly-silicon thin film transistor has become the mainstream of the active device according to the development of the low temperature poly-silicon technology.

The top gate thin film transistor has the advantages of large process window, simple fabrication process and small size. Therefore, top gate thin film transistors are broadly used in the pixel structures and the peripheral circuit of the conventional active matrix organic electroluminescent devices. The characteristic of top gate thin film transistors, however, are sensitive to the cleaning process before date insulator deposition, resulting in undesirable clean mura defects in the active matrix OLED devices.

Besides, for the bottom emission AM-OLED device, when the top gate thin film transistors serving as the switching thin film transistor expose to sunlight, current leakage occurs in the channel region even if the switching thin film transistor is turned off. The data signal stored in the storage capacitor would deteriorate and therefore affect the stability of the OLED display. Furthermore, the storage capacitor and the power line occupy the pixel area and this would reduce the aperture ratio of the pixel structure.

Therefore, it is necessary to develop a novel active matrix organic electroluminescent device to solve the aforementioned problems.

BRIEF SUMMARY OF THE INVENTION

Systems for displaying images are provided. An exemplary embodiment of a system comprises an active matrix organic electroluminescent device, having a substrate, and a plurality of scan lines and data lines disposed on the substrate, for defining a plurality of pixel regions. In particular, each pixel structure comprises a switching thin film transistor, a driving thin film transistor, and a storage capacitor. The switching thin film transistor comprises a first channel layer, first source/drain regions disposed at both sides of the first channel layer, a first gate electrode disposed above the first channel layer, and a first conductive layer disposed under the channel layer. The driving thin film transistor comprises a second channel layer, second source/drain regions disposed at both sides of the first channel layer, a second gate electrode disposed under the second channel layer, and a second conductive layer disposed above the second channel layer. The storage capacitor comprises two first electrodes, and a second electrode disposed between the first electrodes, wherein the first conductive layer, the second gate electrode and the lower first electrode are of the same material and formed by the same process. Further, a pixel electrode electrically connects to the second source/drain regions of the driving thin film transistor via a first contact. Wherein, the second electrode electrically connects to the second source/drain regions of the driving thin film transistor via a second contact, and the two first electrodes electrically connect to the first source/drain regions of switching thin film transistor via a third contact.

Methods for fabricating systems for displaying images are also provided. In an exemplary embodiment of a method for fabricating systems for displaying images having an active matrix organic electroluminescent device, a substrate is provided, wherein the substrate has a switching thin film transistor region, a driving thin film transistor region, and a storage capacitor region. A first conductive layer, a first gate electrode, and a lower first electrode are formed respectively within the switching thin film transistor region, the driving thin film transistor region, and the storage capacitor region. A first dielectric layer is formed on the substrate to cover the first conductive layer, the lower first electrode, and the first gate electrode. A first poly island, a second poly island, and a third poly island are formed on the first dielectric layer respectively within the switching thin film transistor region, the driving thin film transistor region, and the storage capacitor region. A doping process is subjected to the third poly island to form a second electrode. A second dielectric layer is formed on the substrate to cover the poly islands and the second electrode. A second gate electrode is formed on the second dielectric layer over the first poly island. A higher first electrode is formed on the second dielectric layer over a part of the second electrode. A second conductive layer is formed on the second dielectric layer over the second poly island. A first source and drain region are formed in the first poly island to define a first channel region located between the first source and drain regions. A second source region and a second drain region are formed in the second poly island to define a second channel region located between the second source and drain regions. A passivation layer is formed on the substrate. A first contact is formed to contact the second drain electrode, and a pixel electrode is formed to electrically connect to the second drain electrode via the first contact. A second contact is formed to electrically connect the second source electrode and the second source electrode. A third contact is formed to electrically connect the first drain region, the lower first electrode, and the high first electrode.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
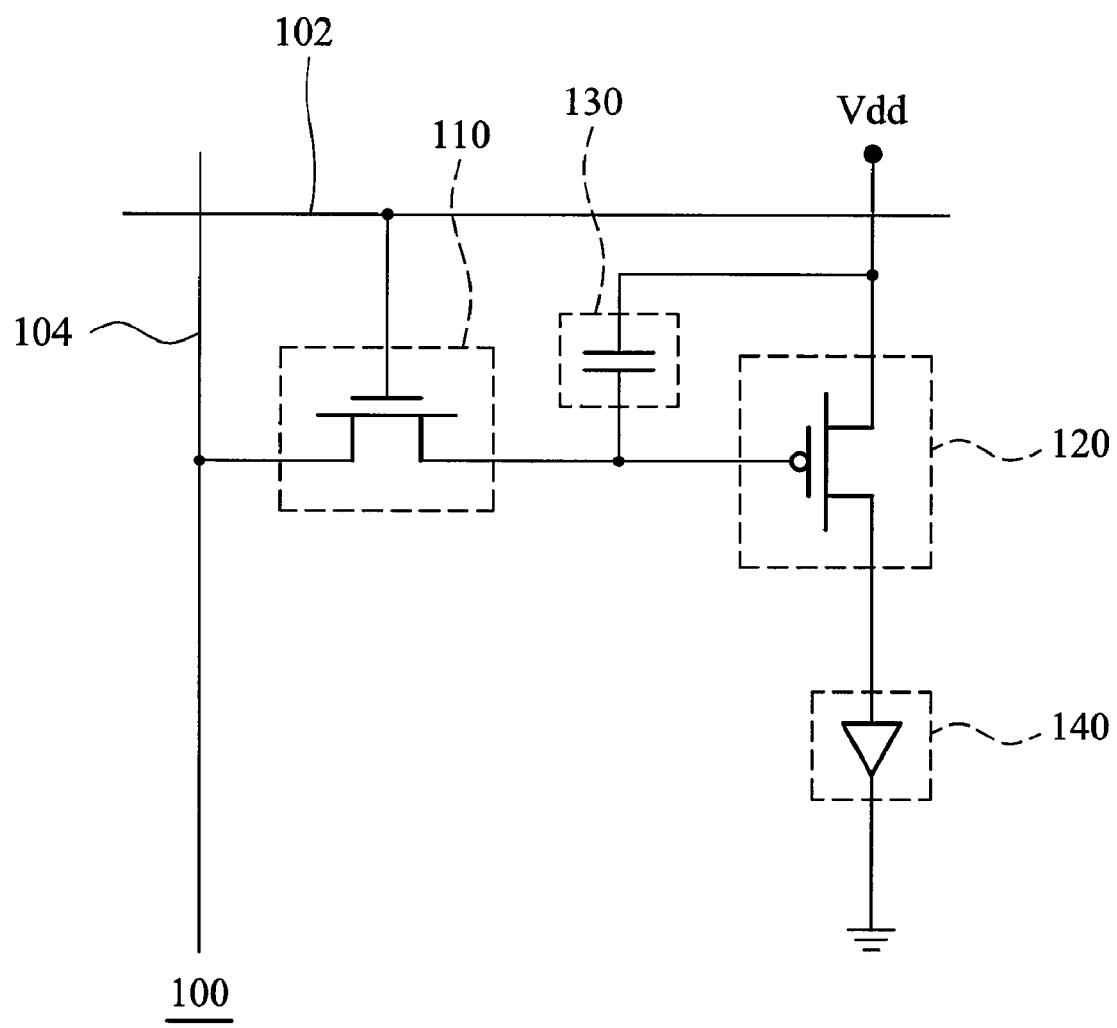
FIG. 1 is a schematic drawing showing a conventional pixel structure of an AM-OLED device.
Figure 2:
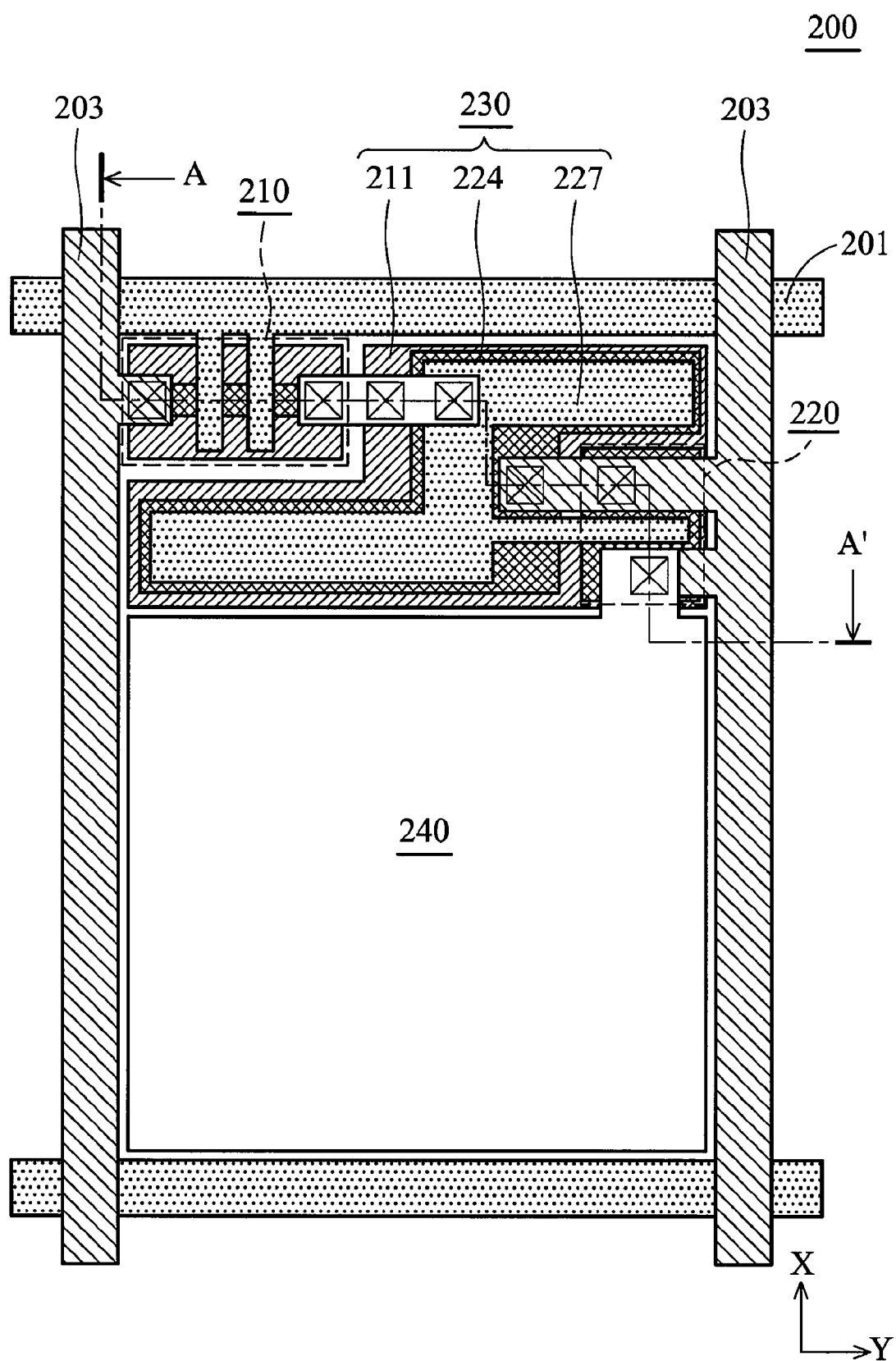
FIG. 2 is a top view illustrating the pixel structure of an active matrix organic electroluminescent device in a system for displaying images according to an embodiment of the invention.
Figure 3A:
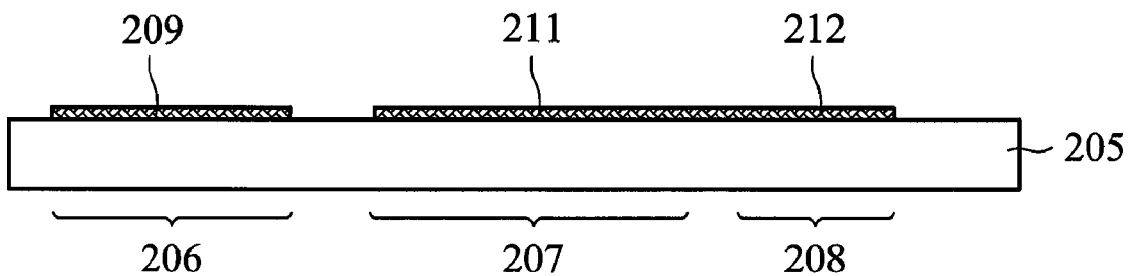
FIGS. 3a to 3q are sectional diagrams of FIG. 2 along line A-A' showing the method for fabricating electroluminescent devices.

FIG. 2 is a schematic top view of one pixel of an embodiment of an active matrix organic electroluminescent device according to the present invention. The active matrix organic electroluminescent device comprises a plurality of pixel areas 200 arranged in a matrix form. Each pixel area 200 comprises a switching thin film transistor 210 electrically connected to a scan line 201 extending along a X direction, a storage capacitor 230, an organic electroluminescent diode 240, and a driving thin film transistor 220 electrically connecting to the organic electroluminescent diode 240 and a data line 203 extending along a Y direction. In the present invention, the switching thin film transistor 210 comprises a first conductive layer, serving as a floating gate, disposed under a first channel layer and opposite to the gate electrode of the switching thin film transistor 210. The first conductive layer serving as the light-shielding layer is adapted for preventing the sunlight from being incident into the switching thin film transistor 210, so as to improve the current leakage occurred in the channel layer. Particularly, the driving thin film transistor 220 employing in the invention can be a bottom gate thin film transistor and have advantages of precisely controlling the current provided to the organic electroluminescent diode 240, avoiding the cleaning mura defects. Further, since the storage capacitor has a multilayer structure and occupies a reduced pixel area, increasing the aperture ratio of the pixel structure. FIGS. 3a to 3q are sectional diagrams along line A-A' of FIG. 2 illustrating the manufacturing process of the active matrix organic electroluminescent device 200 according to a preferred embodiment of the invention.

First, please refer to FIG. 3a, a substrate 205 having a switching thin film transistor region 206, a driving thin film transistor region 208, and a storage capacitor region 207. A first metal layer (not shown) is formed on the substrate 205 and patterned to form a first conductive layer 209 within the switching thin film transistor region 206, a first gate electrode 212 within the driving thin film transistor region 208, and a lower first electrode 211 within the storage capacitor region 207. Wherein, the lower first electrode 211 and the first gate electrode 212 can connect together, referring to FIG. 3a.

Figure 3B:
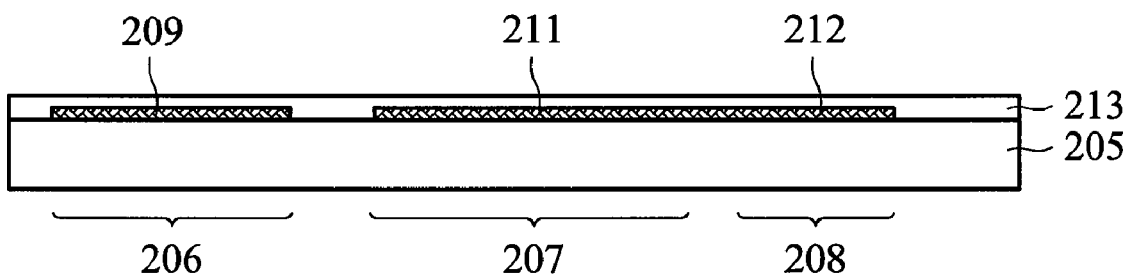

Next, referring to FIG. 3b, a first dielectric layer 213 is formed on the substrate 205 to cover the first conductive layer 209, the lower first electrode 211, and the first gate electrode 212.

Figure 3C:
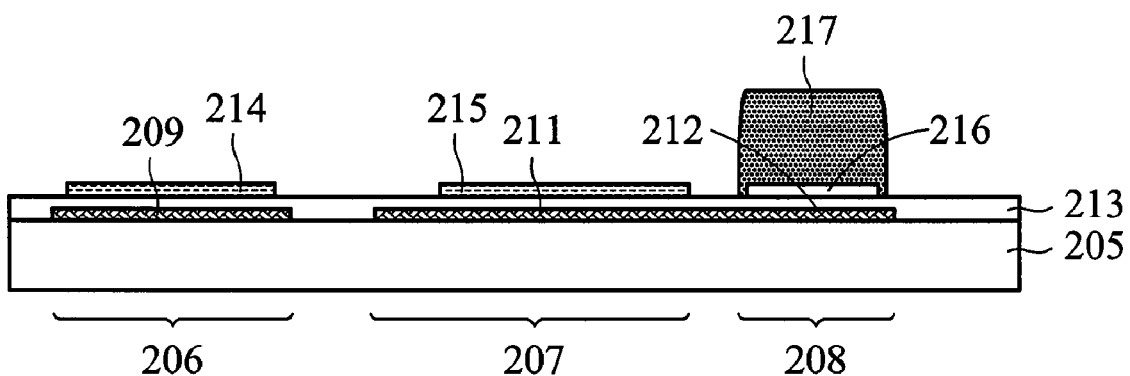

After that, referring to FIG. 3c, a poly silicon layer (not shown) is formed on the first dielectric layer 213 and patterned to form a first poly island 214 on the first dielectric layer 213 within the switching thin film transistor region 206, a second poly island 216 on the first dielectric layer 213 within the driving thin film transistor region 208, and a third poly island 215 on the first dielectric layer 213 within the storage capacitor region 207. Next, a first patterned photoresist layer 217 is formed on the first dielectric layer 213 to cover the second poly island 216.

Figure 3D:
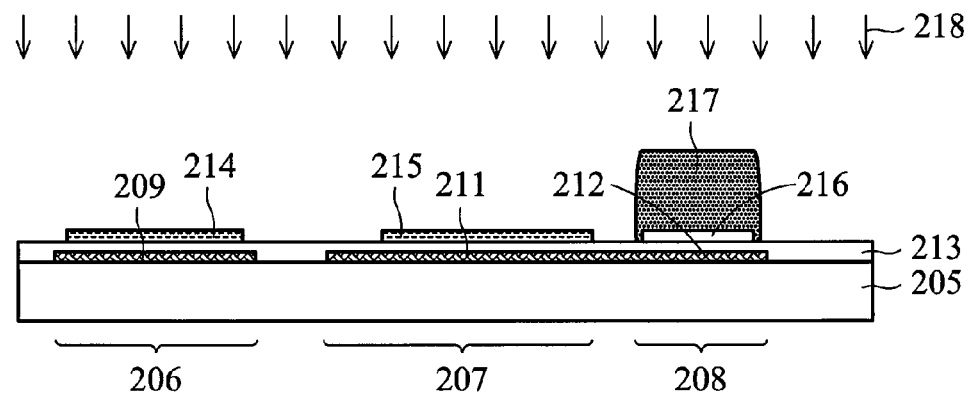

Next, referring to FIG. 3d, a P-type doping process 218 is performed on the first poly island 214 and third poly island 215.

Figure 3E:
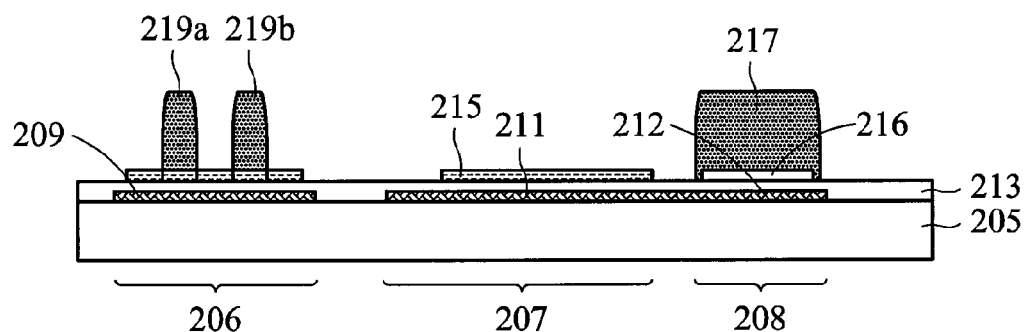
Figure 3F:
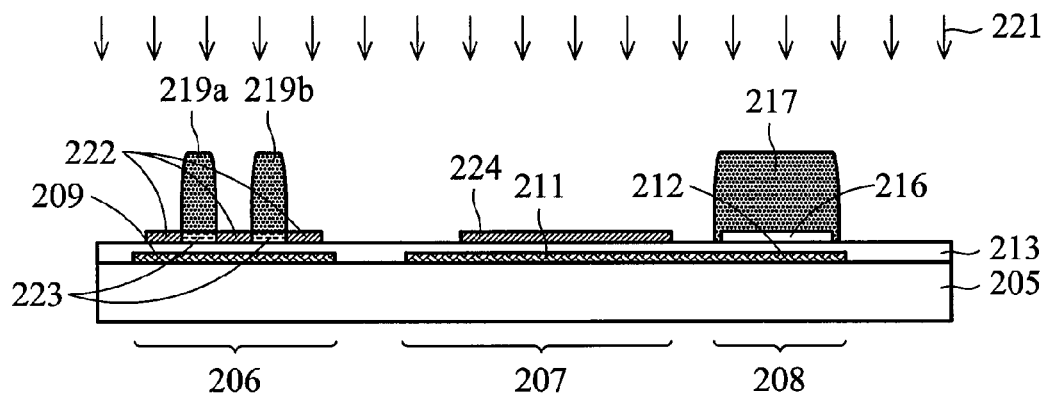

Next, referring to FIG. 3e, second patterned photoresist layers 219a and 219b are formed on a part of the first poly island 214 and separate by a specific distance, wherein the first patterned photoresist layer remains covering the second poly island 216. Then, referring to FIG. 3f, a heavily N-type doping process 221 is performed on the first poly island 214 and third poly island 215 by using the patterned first and second photoresist layers 217, 219a and 219b as the masks in order to form the first source and drain regions 222 and the second electrode 214 respectively. The channel regions 223 are located between the first source/drain regions 222.

Figure 3G:
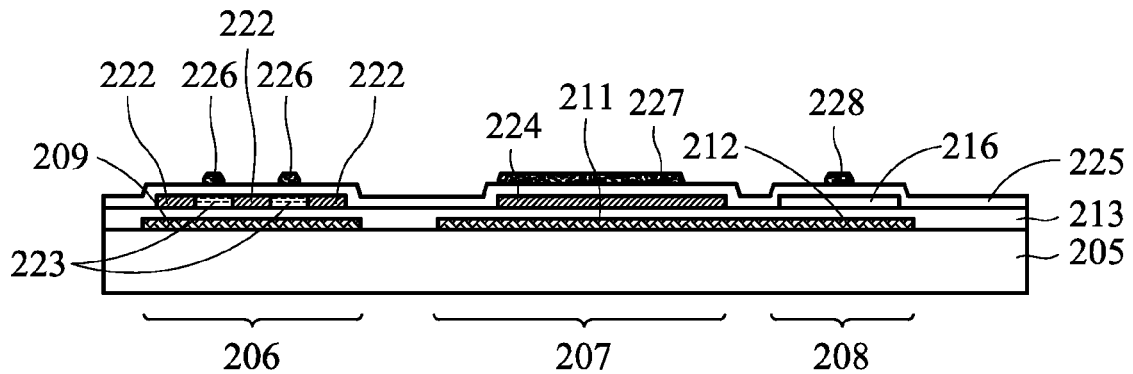

After the heavily N-type doping process 221 is performed, referring to FIG. 3g, the first and second patterned photoresist layers 217, 219a, and 219b are removed. Next, a second dielectric layer 225 and a second metal layer (not shown) are sequentially formed on the first dielectric layer 213 to cover the first source/drain regions 222, the channel regions 223, the second poly island 216 and the second electrode 224. Next, the second metal layer is then patterned to form a second gate electrode 226 on the second dielectric layer 225 over the channel layer 223 of the first poly island 214, a higher first electrode 227 on the second dielectric layer 225 over a part of the second electrode 224 (exposing a part of the top surface of the second electrode 224), and a second conductive layer 228 on the second dielectric layer 225 over the second poly island 216.

It should be noted that the scan lines 201 can be formed by the same patterning process with the second gate electrode 226, the higher first electrode 227, and the second conductive layer 228.

Figure 3H:
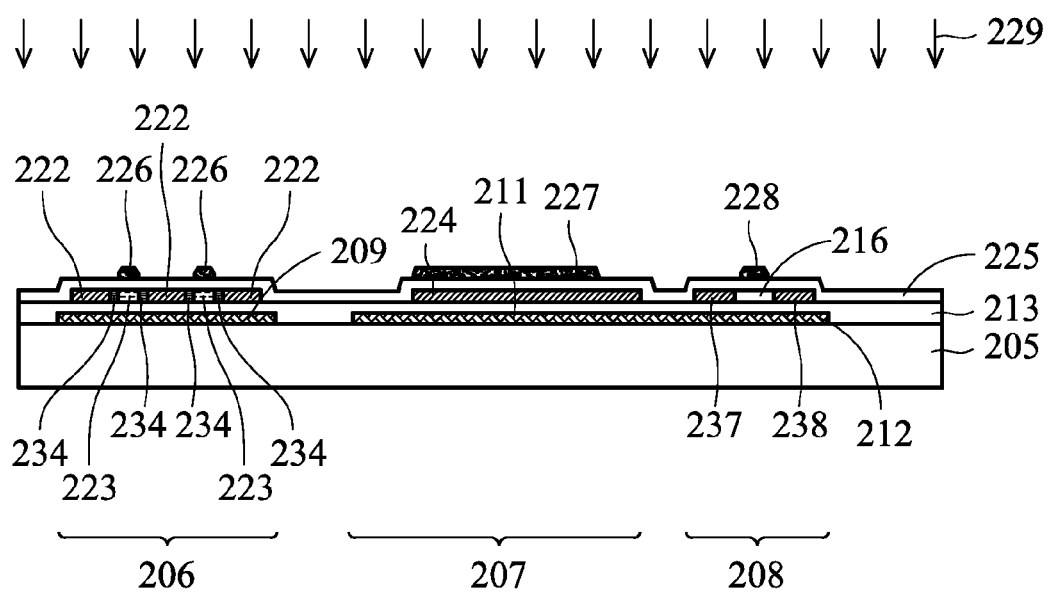

After patterning the second metal layer, referring to FIG. 3h, a light doping process 229 with an N-type dopant is performed on the first and second poly islands 214 and 216 by using the second gate electrode 226 and second conductive layer 228 as the masks, so as to form lightly doped drains (LDD) 234 in the first poly island 214. After the light doping process 229 is performed, the channel layers 223 of the switching thin film transistor 210 are located between the lightly doped drains (LDD) 234.

Figure 3I:
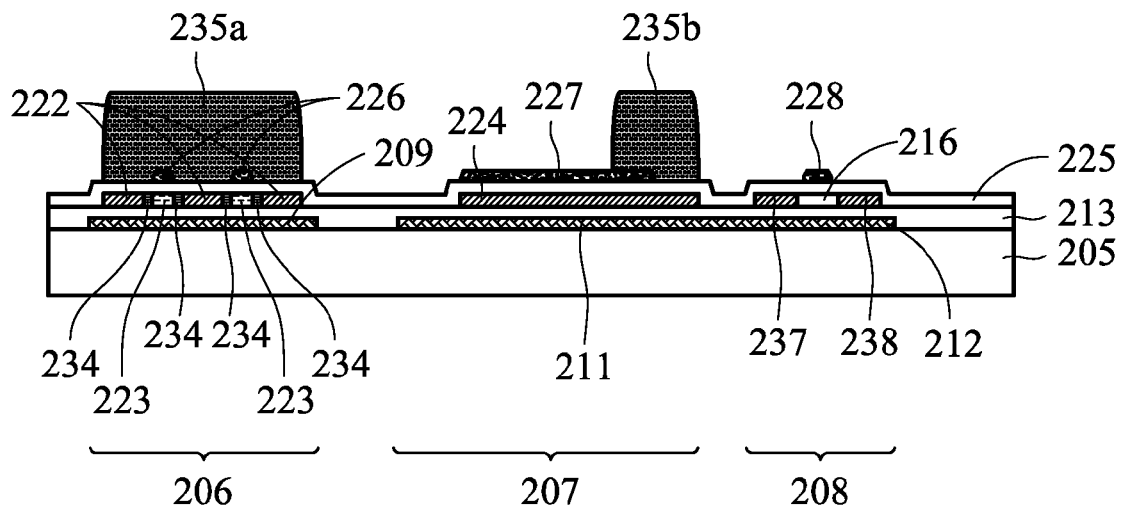

Next, referring to FIG. 3i, a third patterned photoresist layers 235a and 235b are formed on the second dielectric layer 225. The third patterned photoresist layer 235a covers the switching thin film transistor region 206, and the third patterned photoresist layer 235b formed over the second electrode 224 uncovered by the higher first electrode 227.

Figure 3J:
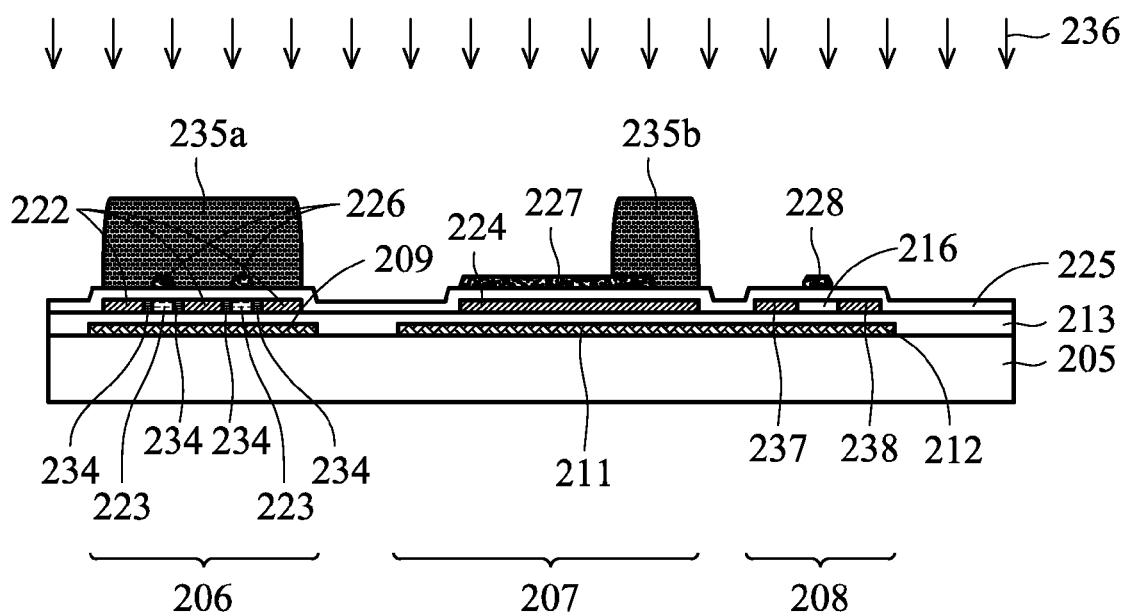

Next, referring to FIG. 3j, a heavy P-type doping process 236 is performed on the second poly islands 216 by using the second conductive layer 228 as the masks, to form a second drain region 237 and a second drain region 238

Figure 3K:
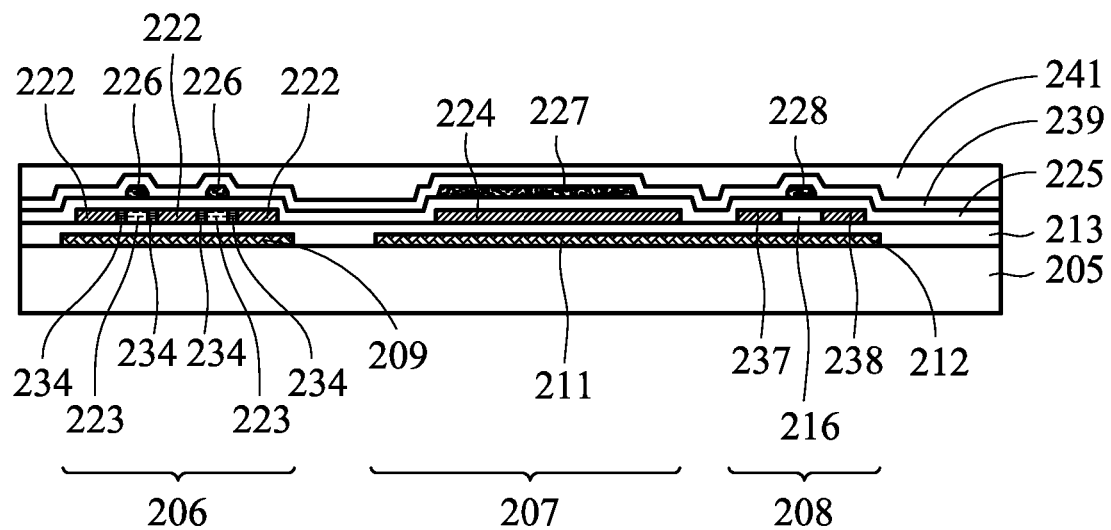

Referring to FIG. 3k, after the heavily P-type doping process 236 is performed, the third patterned photoresist layers 235a and 235b are removed. Thus far, the basic structures of the switching thin film transistor 210, the storage capacitor 230, and the driving thin film transistor 220 are formed. Next, a third dielectric layer 239 is formed on substrate 205 to cover the switching thin film transistor 210, the storage capacitor 230, and the driving thin film transistor 220, and then an optional dielectric layer 241 is blanketly formed on the third dielectric layer 239.

Figure 3L:
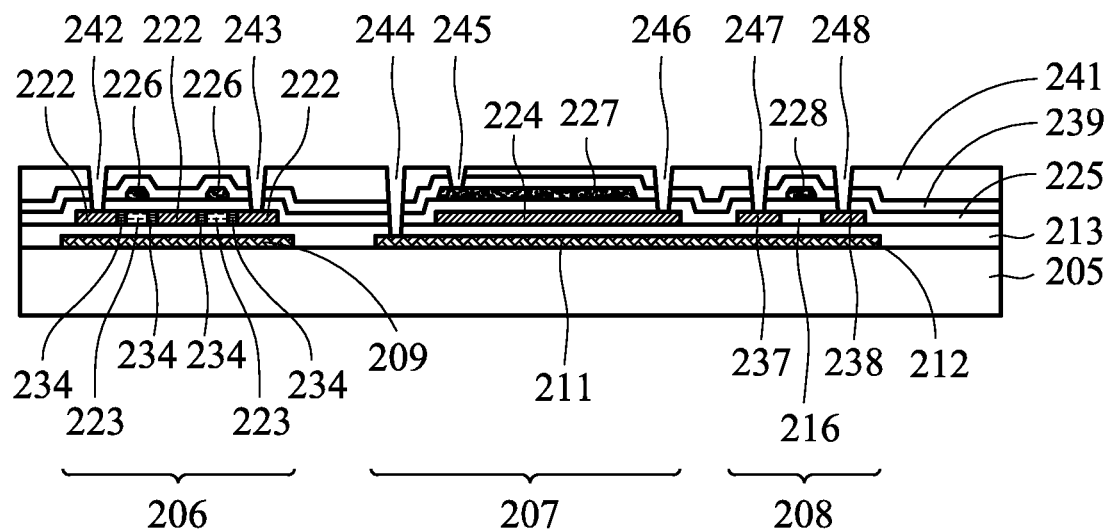

Next, referring to FIG. 3l, a plurality of via holes 242~248 are formed to pass through the optional dielectric layer 241, the third dielectric layer 239, the second dielectric layer 225, and (or) the first dielectric layer 213. Specifically, the first and second via holes 242 and 243 expose the first source and drain regions 222, the third via hole 244 the lower first electrode 211, the forth via hole 245 the lower first electrode 211, the fifth via hole 246 the second electrode 224, the sixth via hole 247 the second source region 237, and the seventh via hole 248 the second drain region 238.

Figure 3M:
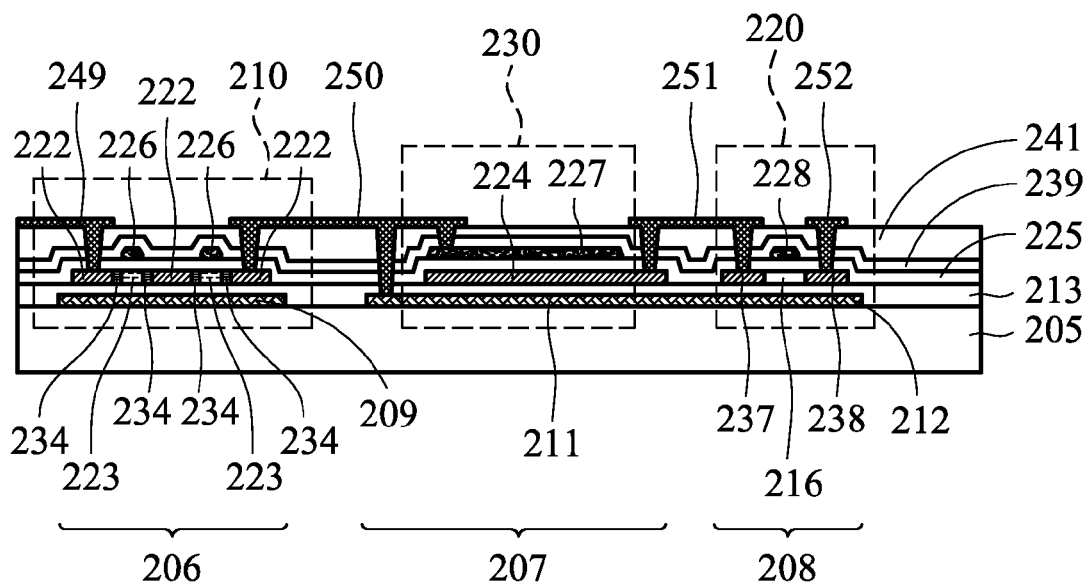

Next, referring to FIG. 3m, a first contact 252 is formed to electrically connect the second drain region 238 through the seventh via hole 248. A second contact 251 is formed to electrically connect the second source region 237 (through the fifth via hole 247) and the second electrode 224 (through the sixth via hole 246). A third contact 250 is formed to electrically connect the first source and drain regions 222 (through the second via hole 243), the lower first electrode 211 (through the third via hole 244), and the higher first electrode 227 (through the fourth via hole 245). A forth contact 249 is formed to electrically connect the first source and drain regions 222 through the first via hole 242. Specifically, the first contact 252, the second contact 251, the third contact 250, and the fourth contact 249 are of the same material and formed by the same process with a data line 203 (shown in FIG. 2).

Figure 3N:
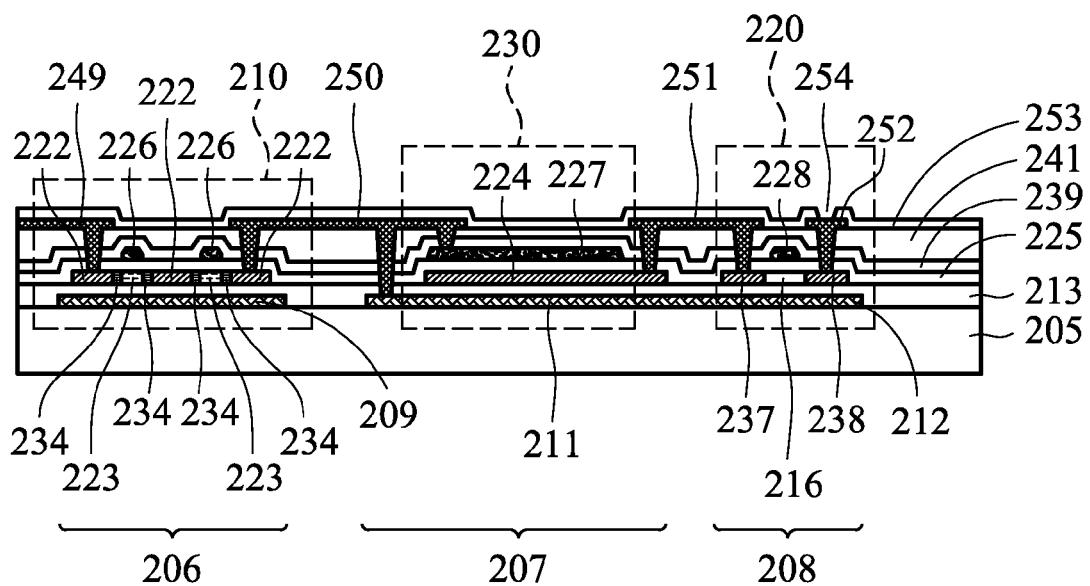

Next, referring to FIG. 3n, a passivation layer 253 is formed on the substrate 205, covering the contacts 249~252. After forming the passivation layer 253, the passivation layer 253 is patterned to form a eighth via hole 254 passing therethrough, exposing the first contact 252.

Figure 3O:
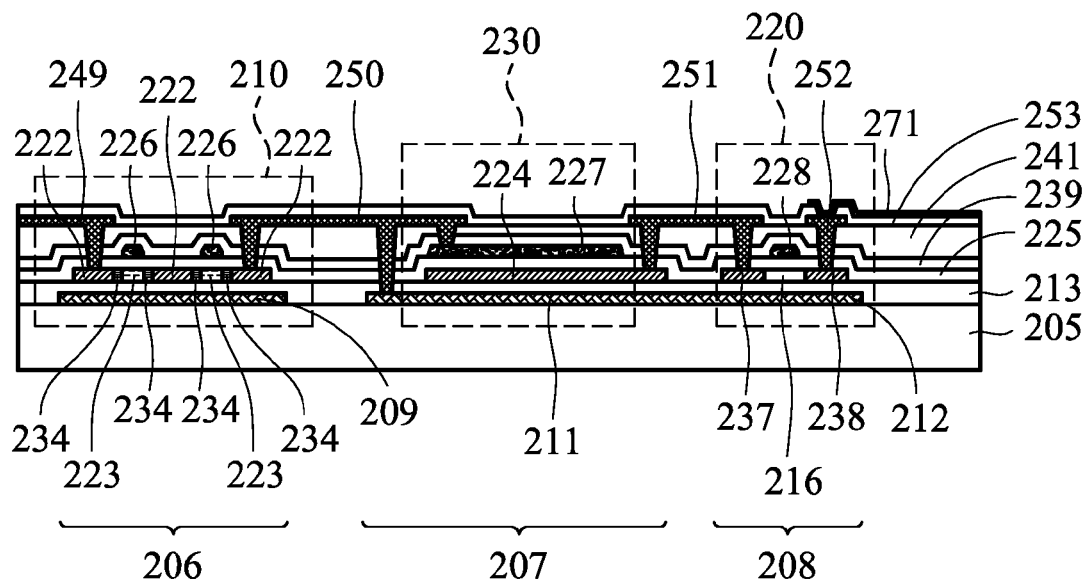
Figure 3P:
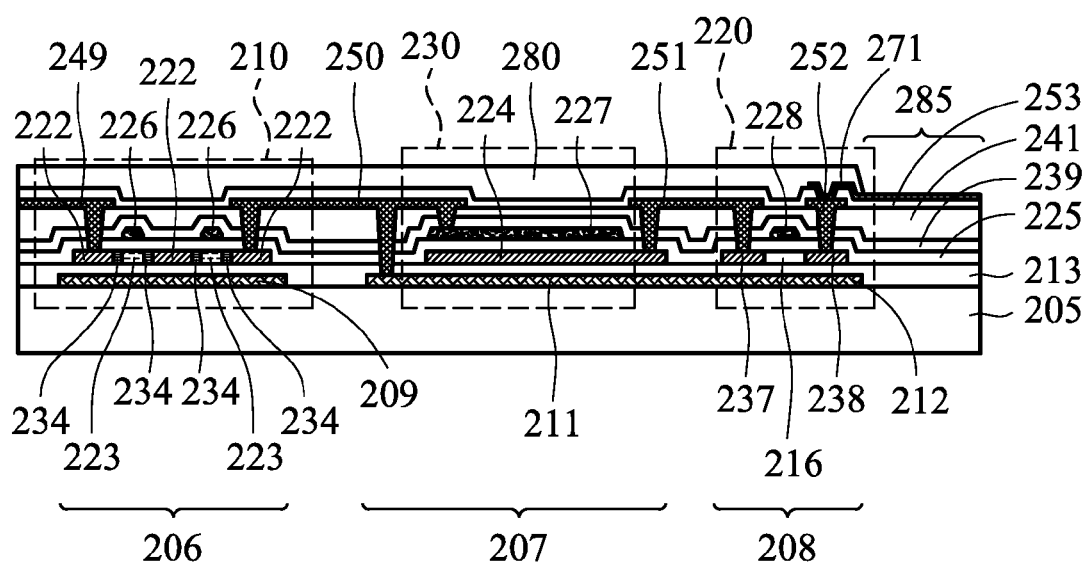
Figure 3Q:
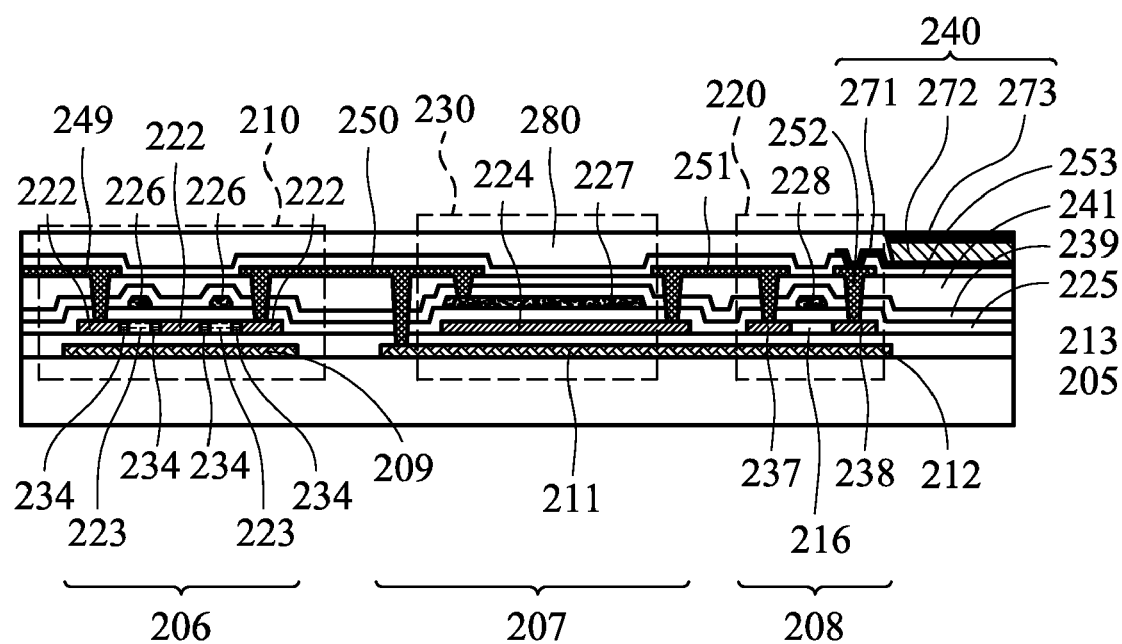

Next, referring to FIG. 3o, a pixel electrode 271 is formed to electrically connect to the second drain region 238 through the first contact 252. Next, referring to FIG. 3p, a pixel definition layer 280 is then formed on the passivation layer 253 to define a predetermined display region 285. Suitable material for the pixel electrode 271 is transparent metal or metal oxide, such as indium tin oxide (ITO), indium zinc oxide (IZO), aluminum zinc oxide (AZO), or zinc oxide (ZnO). Preferably, the transparent anode electrode 105 is formed by sputtering, electron beam evaporation, thermal evaporation, or chemical vapor deposition.

Finally, referring to FIG. 3q, electroluminescent layers 272 and a cathode electrode 273 are sequentially formed on the predetermined display region 285. Specifically, the pixel electrode 271 (serving as an anode), the electroluminescent layers 272, and the cathode electrode 273 comprise a organic electroluminescent diode 240. The electroluminescent layers 272 may comprise a hole injection layer, a hole transport layer, an emission layer, and an electron transport layer, including organic semiconductor materials, such as small molecule materials, polymer, or organometallic complex, formed by thermal vacuum evaporation, spin coating, dip coating, roll-coating, injection-filling, embossing, stamping, physical vapor deposition, or chemical vapor deposition. The cathode electrode 273 can be capable of injecting electrons into an organic electroluminescent layer, for example, a low work function material such as Ca, Ag, Mg, Al, Li, or alloys thereof.

In this embodiment, the second gate electrode 226 is electrically connected to the scan line 201 (shown in FIG. 2) in order to make the switching thin film transistor 210 a top gate thin film transistor, while the first conductive layer 209 serves as the floating gate and light-shielding layer of the switching thin film transistor 210. Besides, the driving thin film transistor can be a bottom gate thin film transistor, while the second conductive layer 228 serves as a floating gate.

The light-shielding layer (first conductive layer 209) can prevent the sunlight from being incident into the thin film transistor, so as to avoid the current leakage occurred in the channel layer. On the contrary, if the first conductive layer is electrically connected to the scan line, the switching thin film transistor 210 is a bottom gate thin film transistor. In light of the above, the switching thin film transistor 210 can be a top gate or a bottom gate thin film transistor according to different requirements. Therefore, the flexibility of applications of the thin film transistors can be enhanced. Further, since the storage capacitor 230 has a multilayer structure and occupies a reduced pixel area, increasing the aperture ratio of the pixel structure.

Figure 4:
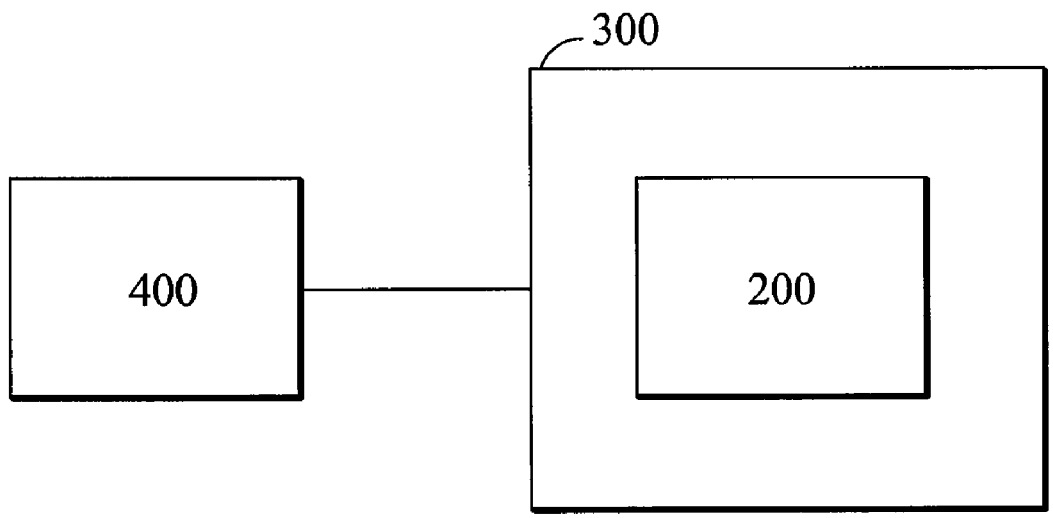
FIG. 4 schematically shows another embodiment of a system for displaying images.

FIG. 4 schematically shows another embodiment of a system for displaying images which, in this case, is implemented as a display panel 300 or an electronic device 500. The described active matrix organic electroluminescent device can be incorporated into a display panel that can be an OLED panel. As shown in FIG. 4, the display panel 300 comprises an active matrix organic electroluminescent device, such as the active matrix organic electroluminescent device 200 shown in FIG. 2. The display panel 300 can form a portion of a variety of electronic devices (in this case, electronic device 500). Generally, the electronic device 500 can comprise the display panel 300 and an input unit 400. Further, the input unit 400 is operatively coupled to the display panel 300 and provides input signals (e.g., an image signal) to the display panel 400 to generate images. The electronic device 500 can be a mobile phone, digital camera, personal digital assistant (PDA), notebook computer, desktop computer, television, car display, or portable DVD player, for example.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
an active matrix organic electroluminescent device, comprising:
a substrate;
a plurality of scan lines and data lines disposed on the substrate, for defining a plurality of pixel regions, wherein each pixel structure comprises:
a switching thin film transistor, comprising a first channel layer, first source/drain regions disposed at both sides of the first channel layer, a first gate electrode disposed above the first channel layer, and a first conductive layer disposed under the first channel layer;
a driving thin film transistor, comprising a second channel layer, second source/drain regions disposed at both sides of the second channel layer, a second gate electrode disposed under the second channel layer, and a second conductive layer disposed above the second channel layer;

a storage capacitor, comprising two first electrodes, and a second electrode disposed between the first electrodes, wherein the first conductive layer, the second gate electrode and the lower first electrode are of the same material and formed by the same process; and a pixel electrode electrically connected to the second source/drain regions of the driving thin film transistor via a first contact; and wherein, the second electrode electrically connects to the second source/drain regions of the driving thin film transistor via a second contact, and the two first electrodes electrically connect to the first source/drain regions of switching thin film transistor via a third contact.

2. The system as claimed in claim 1, wherein the lower first electrode and the second gate electrode connect together.

3. The system as claimed in claim 1, wherein the first gate electrode, the higher first electrode, the second conductive layer, and the scan lines are of the same material and formed by the same process.

4. The system as claimed in claim 1, wherein the first and second channel layers and the second electrode are of the same material and formed by the same process.

5. The system as claimed in claim 1, wherein the first contact, the second contact, the third contact, and the date lines are of the same material and formed by the same process.

6. The system as claimed in claim 1, further comprising a first dielectric layer disposed between the first conductive layer, the lower first electrode, and the second gate electrode, and the first and second source/drain regions, the first and second channel layers, and the second electrode.

7. The system as claimed in claim 1, further comprising a second dielectric layer disposed between the first and second source/drain regions, the first and second channel layers, and the second electrode, and the first gate electrode, the higher first electrode, and the second conductive layer.

8. The system as claimed in claim 1, further comprising a passivation layer formed over the switching thin film transistor, the driving thin film transistor, and the storage capacitor, wherein the first contact, the second contact, and the third contact pass through the passivation layer via a plurality of via holes.

9. The system as claimed in claim 1, further comprising an organic electroluminescent diode electrically connected to the second source/drain regions via the first contact.

10. The system as claimed in claim 9, wherein the pixel electrode serves as an anode of the organic electroluminescent diode.

11. The system as claimed in claim 1, further comprising a display panel, wherein the active matrix organic electroluminescent device forms a portion of the display panel.

12. The system as claimed in claim 11, further comprising an electronic device, wherein the electronic device comprises:

the display panel; and an input unit coupled to the display panel operative to provide input to the display panel such that the display panel displays images.

13. The system as claimed in claim 12, wherein the electronic device is a mobile phone, digital camera, PDA (personal data assistant), notebook computer, desktop computer, television, car display, or portable DVD player.

* * * * *